(12) United States Patent
Nakamura

(10) Patent No.: US 10,355,615 B2
(45) Date of Patent: Jul. 16, 2019

(54) RECTIFIER CIRCUIT FOR OPPOSITE-PHASE CURRENTS

(71) Applicant: LAPIS Semiconductor Co., Ltd., Yokohama (JP)

(72) Inventor: Takashi Nakamura, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/938,280

(22) Filed: Mar. 28, 2018

(65) Prior Publication Data

US 2018/0287508 A1    Oct. 4, 2018

(30) Foreign Application Priority Data

Mar. 30, 2017 (JP) ................. 2017-068434

(51) Int. Cl.

| H02M 7/217 | (2006.01) |
|---|---|
| H03K 17/687 | (2006.01) |
| H03K 17/693 | (2006.01) |
| H02M 1/00 | (2006.01) |

(52) U.S. Cl.
CPC ......... *H02M 7/2173* (2013.01); *H02M 7/217* (2013.01); *H03K 17/687* (2013.01); *H03K 17/693* (2013.01); H02M 2001/0048 (2013.01); H03K 2217/0018 (2013.01)

(58) Field of Classification Search
CPC ...... H02M 7/06; H02M 7/068; H02M 7/1623; H02M 7/1626; H02M 7/2173; H02M 7/5381; H02M 7/575; H02M 3/135; H02M 3/137; H02M 3/33592; H02M 1/06; H02M 1/084; H02M 1/4208; H03K 17/687; H03K 17/683; Y02B 70/1475; Y02B 70/1466; H02J 9/062
USPC .................................. 363/123–132
See application file for complete search history.

(56) References Cited

U.S. PATENT DOCUMENTS

| 2,955,247 A * | 10/1960 | Moyer ...................... G05F 1/38 |
| | | 363/91 |
| 3,504,269 A * | 3/1970 | Hallahan, Jr. ....... H02M 7/1557 |
| | | 323/242 |
| 6,646,296 B2 * | 11/2003 | Horiuchi ................. H01L 21/84 |
| | | 257/288 |

(Continued)

FOREIGN PATENT DOCUMENTS

JP    2008-011584 A    1/2008

*Primary Examiner* — Yemane Mehari
(74) *Attorney, Agent, or Firm* — Rabin & Berdo, P.C.

(57) ABSTRACT

A rectifier circuit is configured to receive first and second alternate current (AC) signals that have opposite phases. The rectifier circuit includes a first half-wave rectifier circuit that includes a first metal-oxide-semiconductor (MOS) transistor and a second MOS transistor connected in series, and performs half-wave rectification on the first AC signal to generate a first direct current (DC) signal, a second half-wave rectifier circuit that includes a third MOS transistor and a fourth MOS transistor connected in series, and performs the half-wave rectification on the second AC signal to generate a second DC signal, the first DC signal and the second DC signal being outputted by the rectifier circuit to a load, and a body potential setting circuit configured to set a body potential of each of the first MOS transistor, the second MOS transistor, the third MOS transistor, and the fourth MOS transistor.

16 Claims, 5 Drawing Sheets

(56) References Cited

U.S. PATENT DOCUMENTS

2005/0269974 A1* 12/2005 Ravindra .............. H05B 41/28
                                                     315/308
2011/0242865 A1* 10/2011 Robbins ............ H01L 31/02021
                                                     363/127

* cited by examiner

RECTIFIER CIRCUIT FOR OPPOSITE-PHASE CURRENTS

CROSS REFERENCE TO RELATED APPLICATIONS

This application is based upon and claims the benefit of priority of the prior Japanese Patent Application No. 2017-068434, filed on Mar. 30, 2017, the entire contents of which are incorporated herein by reference.

BACKGROUND OF THE INVENTION

Technical Field

The present invention relates to a rectifier circuit that converts an AC (alternating current) signal to a DC (direct current) signal.

Background Arts

A rectifier circuit that electrically converts an AC signal (AC power) to a DC signal (DC power) is used for a circuit to obtain DC power from a high-frequency weak signal received by an antenna in a passive-type RFID (radio frequency identifier) tag, or to obtain DC power from AC power that is converted from mechanical energy such as weak vibration energy using a mechanical-electric coupling system.

Examples of such a rectifier circuit include a CMOS (complementary metal-oxide-semiconductor) rectifier circuit that performs all-wave rectification on an AC signal by a differential operation to obtain a DC signal, and outputs the DC signal to a load. In a CMOS rectifier circuit, for example, a first half-wave rectifier circuit and a second half-wave rectifier circuit, which have a CMOS configuration by an N-channel type MOS transistor and a P-channel type MOS transistor, are connected in parallel, and are operated in opposite phase to each other by differentially input AC signals, thereby constituting a whole-wave rectifier circuit as a whole. Each MOS transistor functions as a switch, and the gate electrode is connected to an AC signal node of opposite phase to the AC signal applied to the source electrode and the drain electrode.

In this CMOS rectifier circuit, the gate electrode of each MOS transistor is connected to the AC signal node of opposite phase, and therefore, the ON voltage and the ON resistance during the forward operation of the switching circuit can be reduced and the reverse leak current can be reduced. However, if the input AC power is large and the output DC voltage is large, the excessive gate electrode DC bias of each MOS transistor would increase the leak current during reverse operation, which degrades the efficiency of the power conversion.

In order to solve this problem, there is a rectifier circuit described in Japanese Patent Application Laid-open Publication No. 2008-11584, for example. Specifically, in the rectifier circuit, a capacitor is inserted in a connection line between the gate electrode of each MOS transistor and the AC signal node of opposite phase. Accordingly, an AC signal that is superimposed on a DC signal (a signal in which an AC component is superimposed on a direct current) is supplied to the gate electrode of each MOS transistor. Further, in the rectifier circuit, the gate electrode of each MOS transistor and the DC terminal are connected to each other via a resistance element.

SUMMARY

In the rectifier circuit disclosed in Japanese Patent Application Laid-open Publication No. 2008-11584, it is possible to set the DC bias potential of the gate electrode of each MOS transistor independent of the DC potential of the AC signal node. This makes it possible to set the DC bias voltage appropriately for various purposes, and the applicable scope of the highly efficient energy conversion characteristics can be adjusted.

However, in the rectifier circuit with such a configuration, power loss occurs in the resistance element connected between the gate electrode and the DC terminal, and thus, it is necessary that the resistance element has a high resistance and small parasitic capacitance. A possible solution to address this issue is to replace the resistance element with a high-resistance transistor, but in this case, the resistance value would fluctuate depending on the AC signal, and therefore, it would not be possible to provide a stable AC bias voltage to the gate electrode of each MOS transistor. As a result, the efficiency of the rectifier would decrease.

The present invention was made in view of such a problem, and is aiming at providing a rectifier circuit that can covert power with a high conversion efficiency.

According to an aspect of the invention, a rectifier circuit configured to receive first and second alternate current (AC) signals that have opposite phases, includes a first half-wave rectifier circuit that includes a first metal-oxide-semiconductor (MOS) transistor and a second MOS transistor connected in series, and performs half-wave rectification on the first AC signal to generate a first direct current (DC) signal, a second half-wave rectifier circuit that includes a third MOS transistor and a fourth MOS transistor connected in series, and performs the half-wave rectification on the second AC signal to generate a second DC signal, the first DC signal and the second DC signal being outputted by the rectifier circuit to a load, and a body potential setting circuit configured to set a body potential of each of the first MOS transistor, the second MOS transistor, the third MOS transistor, and the fourth MOS transistor.

According to another aspect of the invention, a rectifier circuit configured to receive first and second alternate current (AC) signals that have opposite phases, includes a first half-wave rectifier circuit that includes a first metal-oxide-semiconductor (MOS) transistor and a second MOS transistor that are connected in series, and performs half-wave rectification on the first AC signal to generate a first direct current (DC) signal, a second half-wave rectifier circuit that includes a third MOS transistor and a fourth MOS transistor that are connected in series, and performs the half-wave rectification on the second AC signal to generate a second DC signal, the first DC signal and the second DC signal being outputted by the rectifier circuit to a load, and a gate potential supply circuit that supplies a DC bias potential to a gate of each of the first MOS transistor, the second MOS transistor, the third MOS transistor, and the fourth MOS transistor.

According to another aspect of the invention, a rectifier circuit includes a first to k-th rectifier circuits (k is an integer of 3 or greater) connected in cascade and being configured to convert an applied alternate current (AC) signal to a direct current (DC) signal. Each of the first to k-th rectifier circuits including a first half-wave rectifier circuit that has an input terminal and an output terminal, and performs half-wave rectification on a first AC signal to generate a first DC signal, and a second half-wave rectifier circuit that has an input terminal and an output terminal, and performs the half-wave rectification on a second AC signal to generate a second DC signal. The input terminal and the output terminal of the first half-wave rectifier circuit and the second half-wave rectifier circuit of the first to k-th rectifier circuits are respectively cross-connected to the input terminal and the output terminal of the first half-wave rectifier circuit and the second half-wave rectifier circuit of an adjacent rectifier circuit.

According to the rectifier circuit of the invention, it is possible to obtain a high output voltage with a high energy conversion efficiency.

DETAILED DESCRIPTION OF THE INVENTION

Figure 1:
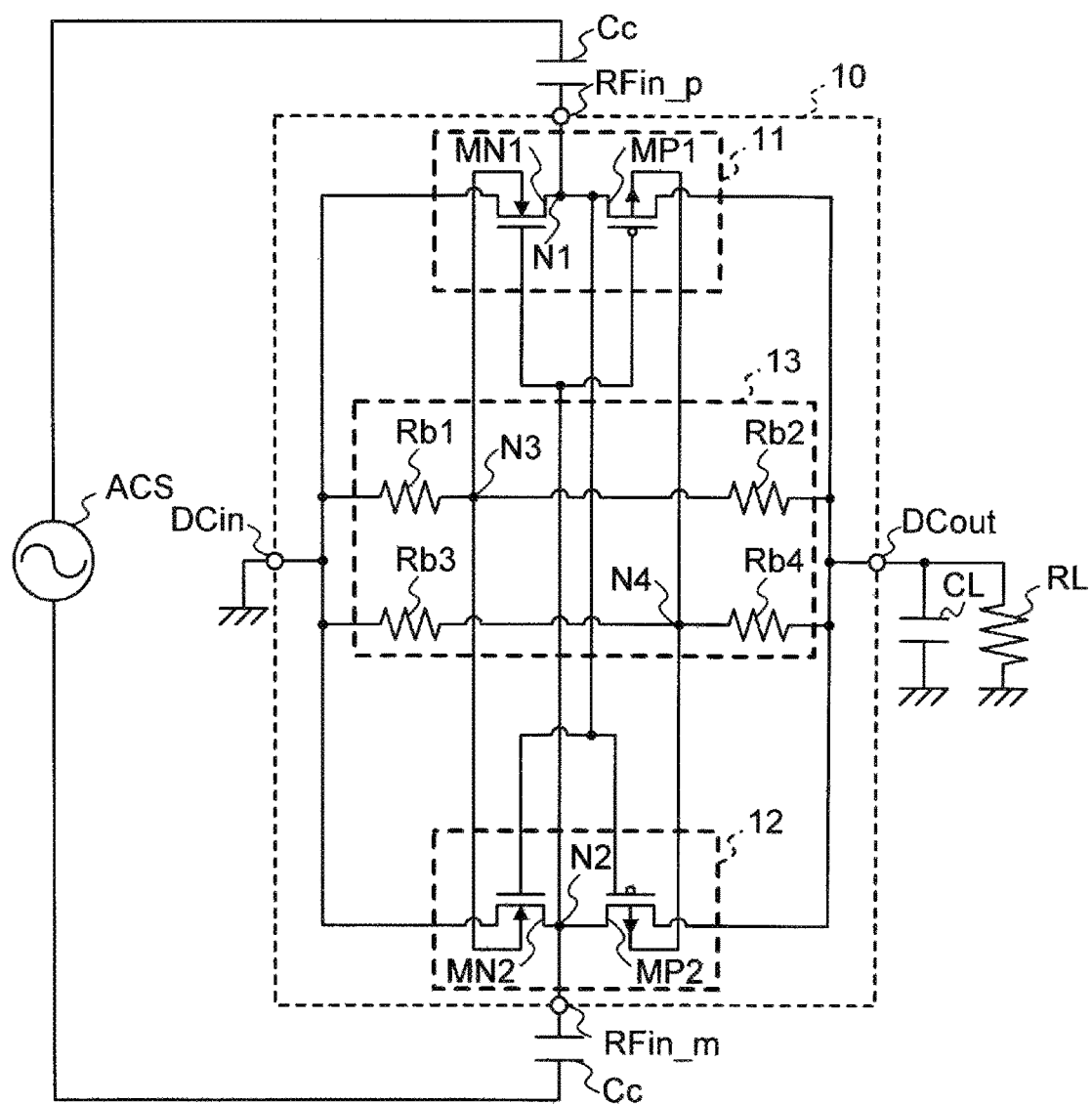
FIG. 1 is a circuit diagram showing the configuration of a rectifier circuit of Embodiment 1.

Embodiments of the present invention will be explained below with reference to figures. In the descriptions of respective embodiments below and appended figures, components and parts that are substantially the same or equivalent to each other are given the same reference characters.

<Embodiment 1>

FIG. 1 is a circuit diagram showing the configuration of a rectifier circuit 10 of Embodiment 1. The rectifier circuit 10 rectifies an AC signal supplied from an AC signal source ACS to generate a DC signal, and supplies the DC signal to a load RL.

The rectifier circuit 10 includes AC terminals RFin_p and RFin_m that receive an AC signal from the AC signal source ACS, DC terminals DCin and DCout to which the rectified signal is output, a transistor MN1, which is an N-channel type (first channel type) MOS transistor, a transistor MP1, which is a P-channel type (second channel type) MOS transistor, a transistor MN2, which is an N channel type MOS transistor, a transistor MP2, which is a P channel type MOS transistor, a resistance Rb1, a resistance Rb2, a resistance Rb3, and a resistance Rb4.

The AC terminals RFin_p and RFin_m have an AC signal applied therebetween. The AC terminal RFin_p is connected to the AC signal source ACS via a coupling capacitance Cc. Similarly, the AC terminal RFin_m is connected to the AC signal source ACS via a coupling capacitance Cc. An AC signal (reverse phase signal) having a phase opposite to that of the AC signal applied to the AC terminal RFin_p is applied to the AC terminal RFin_m.

The DC terminals DCin and DCout are terminals for the DC signals, and a rectified signal is outputted from the DC terminal DCout. In the description below, the DC terminal DCin is also referred to as an input-side DC terminal and the DC terminal DCout is also referred to as an output-side DC terminal. The DC terminal DCin is connected to a ground potential. The DC terminal DCout is connected to the load RL and a capacitance CL.

The transistors MN1 and MN2 are configured as bulk type transistors of triple well structure. Each of the transistors MN1, MN2, MP1 and MP2 has a body (back gate).

In the transistor MN1, one of the source and the drain is connected to the AC terminal RFin_p, and the other is connected to the DC terminal DCin. The transistor MN1 is connected in series to the transistor MP1 via an AC signal node N1, which is a connection point with the AC terminal RFin_p. The gate electrode of the transistor MN1 is connected to an AC signal node N2, which is a node of an AC signal of opposite phase to the AC signal applied to the AC signal node N1.

In the transistor MP1, one of the source and the drain is connected to the AC terminal RFin_p, and the other is connected to the DC terminal DCout. The transistor MP1 is connected in series to the transistor MN1 via the AC signal node N1, which is a connection point with the AC terminal RFin_p. The gate electrode of the transistor MP1 is connected to the AC signal node N2, which is a node of an AC signal of opposite phase to the AC signal applied to the AC signal node N1.

In the transistor MN2, one of the source and the drain is connected to the AC terminal RFin_m, and the other is connected to the DC terminal DCin. The transistor MN2 is connected in series to the transistor MP2 via an AC signal node N2, which is a connection point with the AC terminal RFin_m. The gate electrode of the transistor MN2 is connected to the AC signal node N1, which is a node of an AC signal of opposite phase to the AC signal applied to the AC signal node N2.

In the transistor MP2, one of the source and the drain is connected to the AC terminal RFin_m, and the other is connected to the DC terminal DCout. The transistor MP2 is connected in series to the transistor MN2 via the AC signal node N2, which is a connection point with the AC terminal RFin_m. The gate electrode of the transistor MP2 is connected to the AC signal node N1, which is a node of an AC signal of opposite phase to the AC signal applied to the AC signal node N2.

The transistors MN1 and MP1 constitute the first half-wave rectifier circuit 11. The transistors MN2 and MP2 constitute the second half-wave rectifier circuit 12. The first half-wave rectification circuit 11 and the second half-wave rectification circuit 12 are connected in parallel, operate in opposite phases by differentially input AC signals, and constitute a full-wave rectification circuit as a whole.

The resistance Rb1 and the resistance Rb2 are connected in series between the DC terminal DCin and the DC terminal DCout. A node N3, which is the connection point of the resistance Rb1 and resistance Rb2, is connected to the body (back gate) of the transistors MN1 and MN2. This way, the potential obtained by dividing the potentials of the DC terminals DCin and DCout by the resistances Rb1 and Rb2 is applied to the bodies of the transistors MN1 and MN2.

The resistance Rb3 and the resistance Rb4 are connected in series between the DC terminal DCin and the DC terminal DCout. A node N4, which is the connection point of the resistance Rb3 and resistance Rb4, is connected to the body (back gate) of the transistors MP1 and MP2. This way, the potential obtained by dividing the potentials of the DC terminals DCin and DCout by the resistances Rb3 and Rb4 is applied to the bodies of the transistors MP1 and MP2.

The resistances Rb1, Rb2, Rb3 and Rb4 function as a body potential setting circuit 13 for setting the body potentials of the transistors MN1, MN2, MP1 and MP2.

If the voltage between the source and the body is VSB, the threshold voltage VTN of an N channel MOS transistor (will be referred to as NMOS below) and the threshold voltage VTP of a P channel type MOS transistor (will be referred to as PMOS below) are expressed by the following Formula 1 and Formula 2, respectively.

Formula 1

$$V_{TN} = V_{T0} + \gamma(\sqrt{2|\phi_F| + V_{SB}} - \sqrt{2|\phi_F|}) \quad (1)$$

Formula 2

$$V_{TP} = V_{T0} - \gamma(\sqrt{2\varphi_F - V_{SB}} - \sqrt{2\varphi_F}) \qquad (2)$$

$\varphi_F$ is a physical parameter having a size of 0.6 to 0.8V, and in the NMOS transistor, $\varphi_F<0$ is satisfied, and in the PMOS transistor, $\varphi_F>0$ is satisfied. $V_{T0}$ is a threshold voltage when $V_{SB}=0$, and the polarity thereof is $V_{T0}>0$ in the NMOS transistor, and $V_{T0}<0$ in the PMOS transistor. $\gamma$ is a constant determined by the device process, and has a value of $\gamma>0$.

By applying a body voltage such that $V_{SB}<0$ to the transistors MN1 and MN2, which are NMOS transistors, the threshold voltage $V_{TN}$ of the transistors MN1 and MN2 can be reduced. Also, by applying a body voltage such that $V_{SB}>0$ to the transistors MP1 and MP2, which are PMOS transistors, the threshold voltage $V_{TP}$ of the transistors MP1 and MP2 can be reduced. This way, it is possible to further reduce the input level of the AC signal to cause the rectifier circuit 10 to start the rectification operation.

Therefore, according to the rectifier circuit 10 of this embodiment, by controlling the voltage dividing ratios of the resistances Rb1, Rb2, Rb3 and Rb4 so as to lower the threshold voltage of each transistor, it is possible to start the rectification operation with the AC signal of lower power and lower voltage amplitude.

<Embodiment 2>

Figure 2:
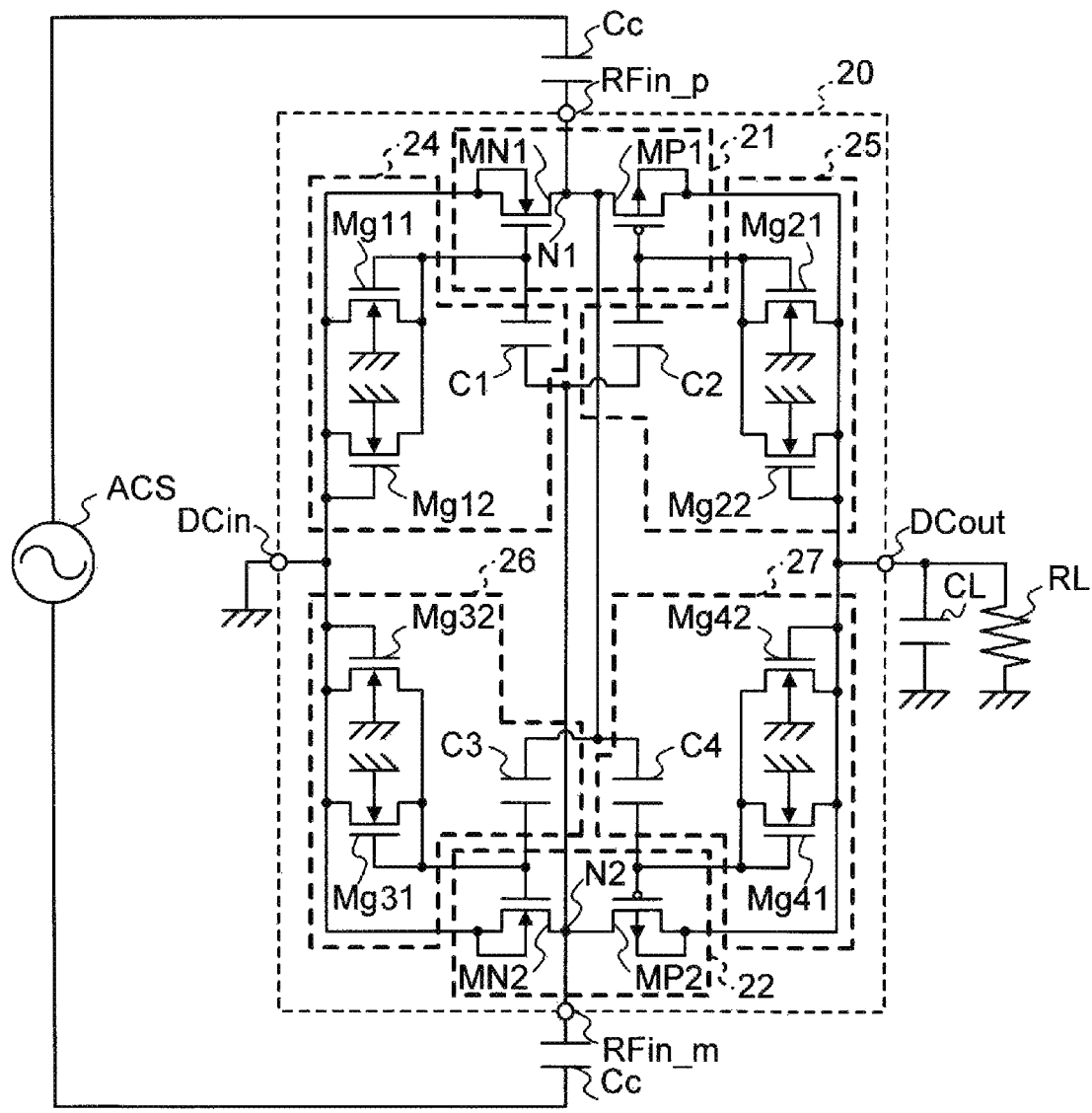
FIG. 2 is a circuit diagram showing the configuration of a rectifier circuit of Embodiment 2.

FIG. 2 is a circuit diagram showing the configuration of a rectifier circuit 20 of Embodiment 2. In a manner similar to the rectifier circuit 10 of Embodiment 1, the rectifier circuit 20 rectifies an AC signal supplied from an AC signal source ACS to generate a DC signal, and supplies the DC signal to a load RL.

The rectifier circuit 20 differs from the rectifier circuit 10 of Embodiment 1 in including transistors Mg11, Mg12, Mg21, Mg22, Mg31, Mg32, Mg41 and Mg42 and capacitances C1, C2, C3 and C4 instead of the resistances Rb1, Rb2, Rb3 and Rb4.

The transistors MN1 and MP1 constitute a first half-wave rectifier circuit 21. The transistors MN2 and MP2 constitute a second half-wave rectifier circuit 22. The first half-wave rectification circuit 21 and the second half-wave rectification circuit 22 are connected in parallel, operate in opposite phases by differentially input AC signals, and constitute a full-wave rectification circuit as a whole.

The capacitance C1 is connected between the gate electrode of the transistor MN1 and the AC signal node N2. The capacitance C1 is provided for connecting the gate electrode of the transistor MN1 and the AC signal node N2 in alternating current and disconnecting the two in direct current.

Similarly, the capacitance C2 is provided for connecting the gate electrode of the transistor MP1 and the AC signal node N2 in alternating current and disconnecting the two in direct current, and is connected between the gate electrode and the AC signal node N2. The capacitance C3 is provided for connecting the gate electrode of the transistor MN2 and the AC signal node N1 in alternating current and disconnecting the two in direct current, and is connected between the gate electrode and the AC signal node N1. The capacitance C4 is provided for connecting the gate electrode of the transistor MP2 and the AC signal node N1 in alternating current and disconnecting the two in direct current, and is connected between the gate electrode and the AC signal node N1.

The transistors Mg11 and Mg12 are diode-connected NMOS transistors, and are connected in parallel in an inverse manner. The gate of the transistor Mg11 is connected to the gate electrode of the transistor MN1, and the gate of the transistor Mg12 is connected to the DC terminal DCin. That is, the gate electrode of the transistor MN1 is connected to the DC terminal DCin via the transistors Mg11 and Mg12.

The transistors Mg21 and Mg22 are diode-connected NMOS transistors, and are connected in parallel in an inverse manner. The gate of the transistor Mg21 is connected to the gate electrode of the transistor MP1, and the gate of the transistor Mg22 is connected to the DC terminal DCout. That is, the gate electrode of the transistor MP1 is connected to the DC terminal DCout via the transistors Mg21 and Mg22.

The transistors Mg31 and Mg32 are diode-connected NMOS transistors, and are connected in parallel in an inverse manner. The gate of the transistor Mg31 is connected to the gate electrode of the transistor MN2, and the gate of the transistor Mg32 is connected to the DC terminal DCin. That is, the gate electrode of the transistor MN2 is connected to the DC terminal DCin via the transistors Mg31 and Mg32.

The transistors Mg41 and Mg42 are diode-connected NMOS transistors, and are connected in parallel in an inverse manner. The gate of the transistor Mg41 is connected to the gate electrode of the transistor MP2, and the gate of the transistor Mg42 is connected to the DC terminal DCout. That is, the gate electrode of the transistor MP2 is connected to the DC terminal DCout via the transistors Mg41 and Mg42.

An AC signal supplied from the AC signal source ACS is applied between the AC terminals RFin_p and RFin_m via coupling capacitance Cc. The rectified DC signal is output between the DC terminals DCin and DCout.

The gate electrode of the transistor MN1 is connected to the AC signal node N2 of the opposite phase in alternating current, and is disconnected from the AC signal node N2 in direct current by the capacitance C1. That is, the DC bias potential of the gate electrode of the transistor MN1 is given by the transistors Mg11 and Mg12 independent of the DC potential of the AC signal node N2. The transistors Mg11 and Mg12, and capacitance C1 have the function of a gate potential supply circuit 24 that supplies the DC bias potential to the gate electrode of the transistor MN1.

The gate electrode of the transistor MP1 is connected to the AC signal node N2 of the opposite phase in alternating current, and is disconnected from the AC signal node N2 in direct current by the capacitance C2. That is, the DC bias potential of the gate electrode of the transistor MP1 is given by the transistors Mg21 and Mg22 independent of the DC potential of the AC signal node N2. The transistors Mg21 and Mg22, and capacitance C2 have the function of a gate potential supply circuit 25 that supplies the DC bias potential to the gate electrode of the transistor MP1.

The gate electrode of the transistor MN2 is connected to the AC signal node N1 of the opposite phase in alternating current, and is disconnected from the AC signal node N1 in direct current by the capacitance C3. That is, the DC bias potential of the gate electrode of the transistor MN2 is given by the transistors Mg31 and Mg32 independent of the DC potential of the AC signal node N1. The transistors Mg31 and Mg32, and capacitance C3 have the function of a gate potential supply circuit 26 that supplies the DC bias potential to the gate electrode of the transistor MN2.

The gate electrode of the transistor MP2 is connected to the AC signal node N1 of the opposite phase in alternating current, and is disconnected from the AC signal node N1 in direct current by the capacitance C4. That is, the DC bias potential of the gate electrode of the transistor MP2 is given by the transistors Mg41 and Mg42 independent of the DC potential of the AC signal node N1. The transistors Mg41 and Mg42, and capacitance C4 have the function of a gate potential supply circuit 27 that supplies the DC bias potential to the gate electrode of the transistor MP2.

As described above, in the rectifier circuit 20 of this embodiment, the DC bias potentials of the transistors MN1, MP1, MN2, and MP2 can be controlled independently of the DC potentials of the AC signal nodes N1 and N2. This makes it possible to set the DC bias potential of each transistor to the optimal value for various purposes, and the applicable scope of the highly efficient energy conversion characteristics can be adjusted.

In the rectifier circuit 20 of this embodiment, the transistors Mg11 and Mg12, which function as the gate potential supply circuit, are connected between the gate electrode of the transistor MN1 and the DC terminal DCin. Similarly, transistors that function as the gate potential supply circuit are connected between the gate electrode of the transistor MP1 and the DC terminal DCout, between the gate electrode of the transistor MN2 and the DC terminal DCin, and between the gate electrode of the transistor MP2 and the DC terminal DCout. With this configuration, the area occupied by the elements is reduced as compared to the case where a resistance element is connected between each of the gate electrodes of the transistors MN1, MP1, MN2, and MP2 and the DC terminals, and it is possible to suppress the parasitic capacitance and power loss.

The transistors constituting the gate potential supply circuit in this embodiment are formed by two diode-connected NMOS transistors connected in parallel with in an inverse manner. Specifically, the two transistor connected in parallel with in an inverse manner are defined by two transistors that are connected in parallel to each other and are forward biased in two directions opposite to each other. That is, a drain of one transistor and a source of the other transistor are connected to have the same potentials, and a source of the one transistor and a drain of the other transistor are connected to have the same potentials. These two transistors are diode-connected transistors, i.e. a transistor in which a gate is connected to a drain (shorted-circuit). By this gate potential supply circuit, the DC bias potential to be supplied to the gate electrodes of the transistors MN1, MP1, MN2 and MP2 can be kept constant without being affected by the AC signal input to the AC terminals RFin_p and RFin_m. Thus, it is possible to provide a stable DC bias potential as compared with a case where a transistor that is not connected in parallel to the other transistor in an inverse manner, for example, a single transistor that has a diode-connected or has no diode-connected, is simply used in place of a resistance element, and it is possible to suppress deterioration in efficiency of power conversion.

According to the rectifier circuit 20 of this embodiment, by using small MOS transistors connected in parallel in an inverse manner as the transistors constituting the gate potential supply circuit, it is possible to realize both small parasitic capacitance and high resistance, and also it is possible to operate the rectifier circuit at a high efficiency with a desired input signal input level without impairing the efficiency of power conversion.

Although the transistors Mg11, Mg12, Mg21, Mg22, Mg31, Mg32, Mg41 and Mg42 have been described as NMOS transistors, PMOS transistors may alternatively be used.

Further, in FIG. 2, the same potential of the DC terminal DCin is supplied to the gate potential supply circuits 24 and 26, and the same potential of the DC terminal DCout is supplied to the gate potential supply circuits 25 and 26, but a potential to be supplied to each of the gate potential supply circuits 24-27 is not limited thereto. Specifically, any DC potential can be supplied to the gate potential supply circuits 24-27. For example, the potential of the DC terminal DCout may be supplied to the gate potential supply circuits 24 and 26, and the potential of the DC terminal DCin may be supplied to the gate potential supply circuits 25 and 27. Furthermore, the rectifier circuit 20 may include a voltage divider circuit similar to the body potential setting circuit 13 of FIG. 1, and a potential of any one end of resistances Rb1-Rb4 may be supplied to the gate potential supply circuits 24-27.

<Embodiment 3>

Figure 3:
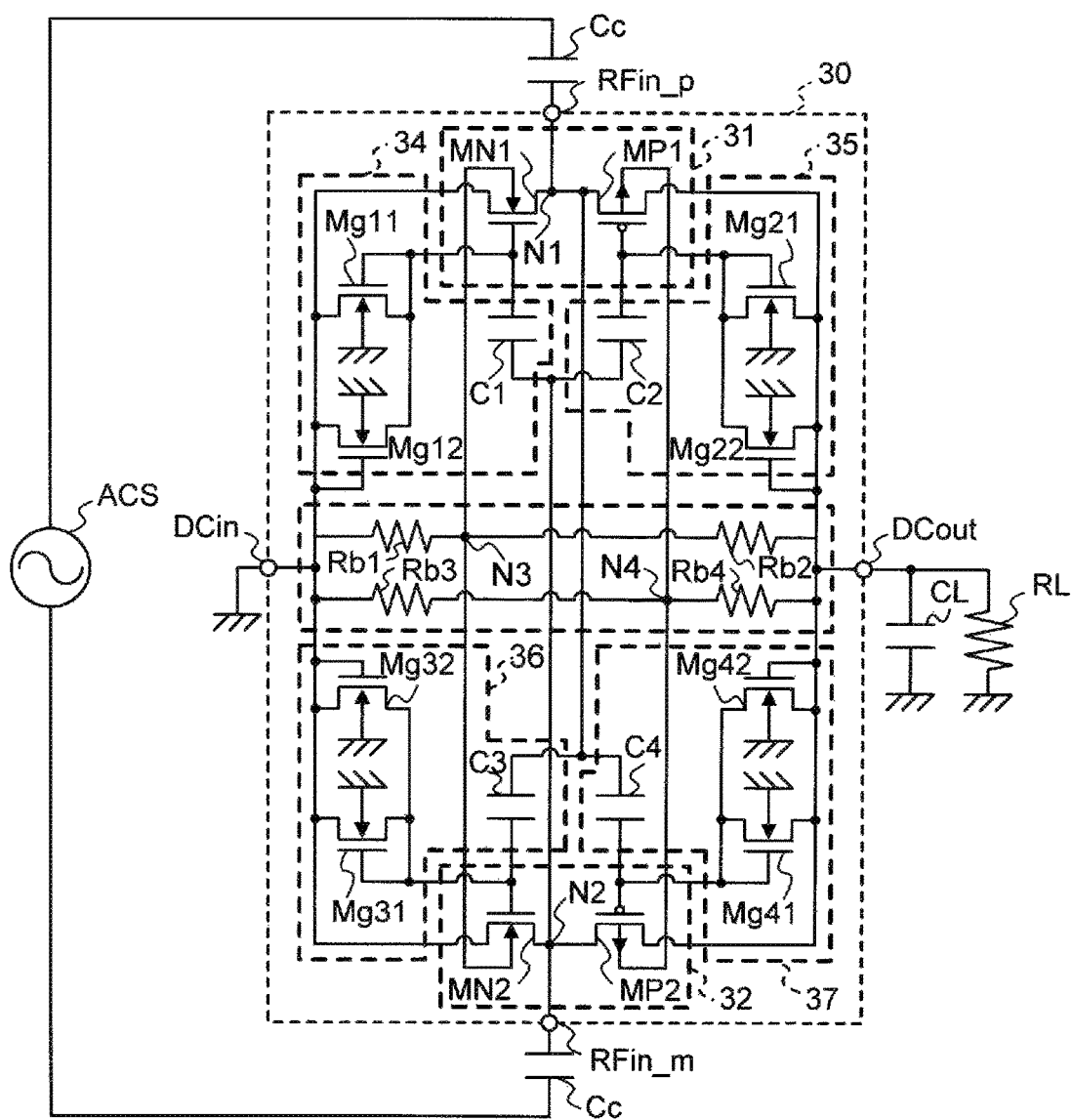
FIG. 3 is a circuit diagram showing the configuration of a rectifier circuit of Embodiment 3.

FIG. 3 is a circuit diagram showing the configuration of a rectifier circuit 30 of Embodiment 3. In a manner similar to the rectifier circuit 10 of Embodiment 1 and the rectifier circuit 20 of Embodiment 2, the rectifier circuit 30 rectifies an AC signal supplied from an AC signal source ACS to generate a DC signal, and supplies the DC signal to a load RL.

The rectifier circuit 30 has a body potential setting circuit 33 that is a circuit similar to the body potential setting circuit 13 in the rectifier circuit 10 of Embodiment 1. That is, a resistance Rb1 and a resistance Rb2 are connected in series between the DC terminal DCin and the DC terminal DCout, and a node N3, which is a connection point of the resistances Rb1 and Rb2, is connected to the bodies of the transistors MN1 and MN2. This way, the potential obtained by dividing the potentials of the DC terminals DCin and DCout by the resistances Rb1 and Rb2 is applied to the bodies of the transistors MN1 and MN2.

Similarly, a resistance Rb3 and a resistance Rb4 are connected in series between the DC terminal DCin and the DC terminal DCout, and a node N4, which is a connection point of the resistances Rb3 and Rb4, is connected to the bodies of the transistors MP1 and MP2. This way, the potential obtained by dividing the potentials of the DC terminals DCin and DCout by the resistances Rb3 and Rb4 is applied to the bodies of the transistors MP1 and MP2.

The rectifier circuit 30 has a gate potential supply circuits 34 to 37 that are circuits similar to the gate potential supply circuits 24 to 27 in the rectifier circuit 20 of Embodiment 2. That is, the gate electrode of the transistor MN1 is connected to the DC terminal DCin via the transistors Mg11 and Mg12, which are diode-connected NMOS transistors connected in parallel in an inverse manner. The gate electrode of the transistor MN1 is connected to the AC signal node N2 of the opposite phase in alternating current, and is disconnected in direct current via the capacitance C1.

Similarly, the gate electrode of the transistor MP1 is connected to the DC terminal DCout via the transistors Mg21 and Mg22, which are diode-connected NMOS transistors connected in parallel in an inverse manner. The gate electrode of the transistor MP1 is connected to the AC signal node N2 of the opposite phase in alternating current, and is disconnected in direct current via the capacitance C2.

The gate electrode of the transistor MN2 is connected to the DC terminal DCin via the transistors Mg31 and Mg32, which are diode-connected NMOS transistors connected in parallel in an inverse manner. The gate electrode of the transistor MN2 is connected to the AC signal node N1 of opposite phase in alternating current, and is disconnected in direct current via the capacitance C3.

The gate electrode of the transistor MP2 is connected to the DC terminal DCout via the transistors Mg41 and Mg42, which are diode-connected NMOS transistors connected in parallel in inverse manner. The gate electrode of the transistor MP2 is connected to the AC signal node N1 of opposite phase in alternating current, and is disconnected in direct current via the capacitance C4.

In the rectifier circuit 30 of this embodiment, by adjusting the voltage dividing ratios of the resistances Rb1, Rb2, Rb3 and Rb4 and controlling the body potentials of the transistors MN1, MN2, MP1 and MP2, the threshold voltage of each transistor can be kept low. Furthermore, the DC bias potential of the transistors MN1, MP1, MN2 and MP2 can be stably controlled independently of the DC potential of the AC signal nodes N1 and N2 without being affected by the AC signal.

Thus, according to the rectifier circuit 30 of this embodiment, it is possible to reduce the input level of the AC signal that can start the rectification operation, and it is possible to operate the rectifier circuit with high efficiency at a desired input level.

<Embodiment 4>

Figure 4:
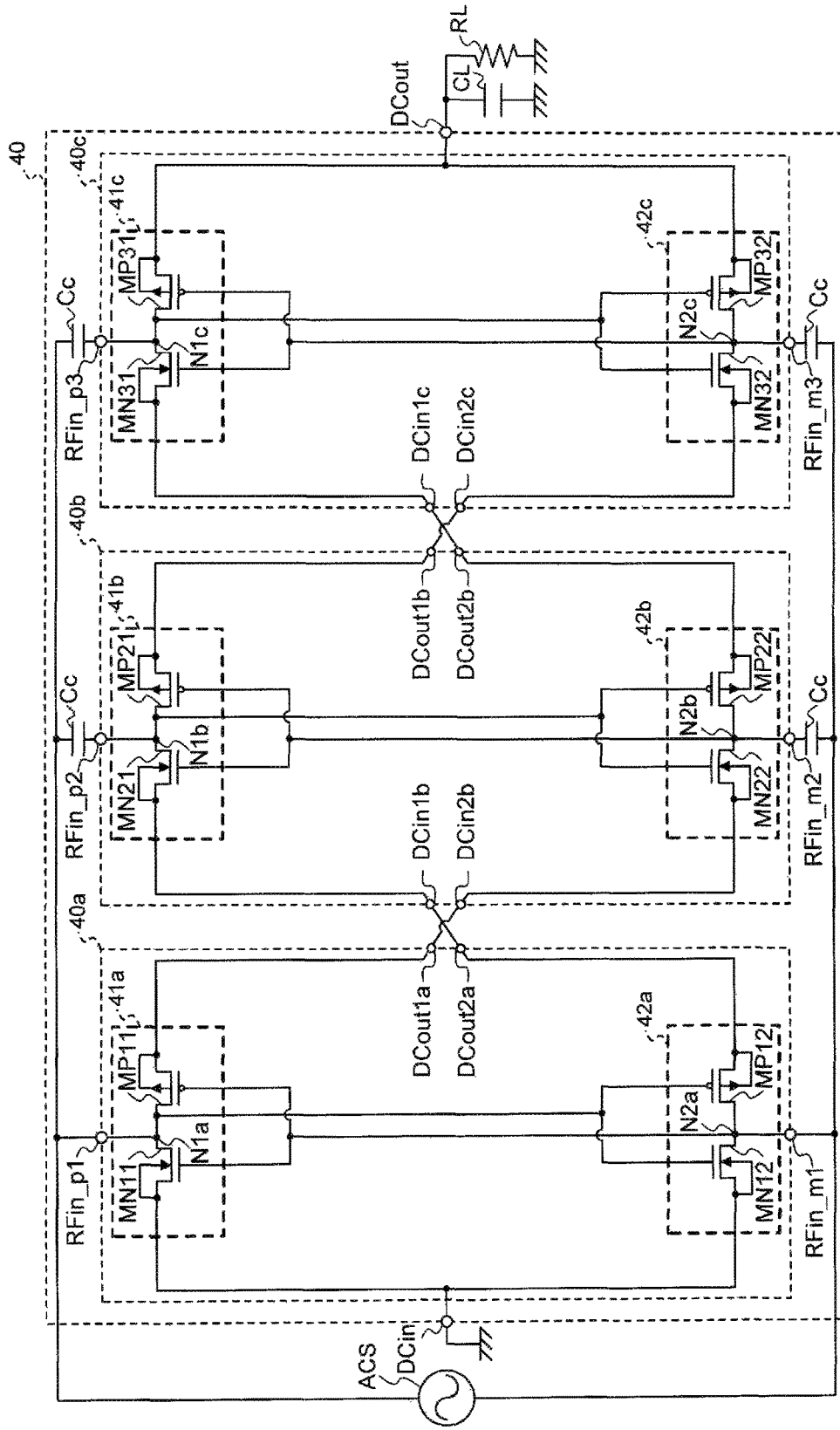
FIG. 4 is a circuit diagram showing the configuration of a rectifier circuit of Embodiment 4.

FIG. 4 is a circuit diagram showing the configuration of a rectifier circuit 40 of Embodiment 4. The rectifier circuit 40 has a configuration in which a first rectifier circuit 40a, a second rectifier circuit 40b, and a third rectifier circuit 40c are cascaded in three stages.

The first rectifier circuit 40a, which is the first stage rectifier circuit, includes a transistor MN11 that is an NMOS transistor, a transistor MP11 that is a PMOS transistor, a transistor MN12 that is an NMOS transistor, and a transistor MP12 that is a PMOS transistor.

The transistors MN11 and MP11 constitute a first half-wave rectifier circuit 41a. The transistors MN12 and MP12 constitute a second half-wave rectifier circuit 42. The first half-wave rectification circuit 41a and the second half-wave rectification circuit 42a are connected in parallel, operate in opposite phases by differentially input AC signals, and constitute a full-wave rectification circuit as a whole.

The first rectifier circuit 40a includes an input-side DC terminal DCin and output-side DC terminals DCout1a and DCout2a that are separated. The DC terminal DCin is connected to a ground potential. The DC terminal DCout1a is connected to the first half-wave rectification circuit 41a, and the DC terminal DCout2a is connected to the second half-wave rectification circuit 42a.

The second rectifier circuit 40b, which is the second stage rectifier circuit, includes a transistor MN21 that is an NMOS transistor, a transistor MP21 that is a PMOS transistor, a transistor MN22 that is an NMOS transistor, and a transistor MP22 that is a PMOS transistor.

The transistors MN21 and MP21 constitute a first half-wave rectifier circuit 41b. The transistors MN22 and MP22 constitute a second half-wave rectifier circuit 42b. The first half-wave rectification circuit 41b and the second half-wave rectification circuit 42b are connected in parallel, operate in opposite phases by differentially input AC signals, and constitute a full-wave rectification circuit as a whole.

The second rectifier circuit 40b includes input-side DC terminals DCin1b and DCin2b that are separated and output-side DC terminals DCout1b and DCout2b that are separated. The DC terminal DCin1b is connected to the first half-wave rectification circuit 41b, and the DC terminal DCin2b is connected to the second half-wave rectification circuit 42b. The DC terminal DCout1b is connected to the first half-wave rectification circuit 41b, and the DC terminal DCout2b is connected to the second half-wave rectification circuit 42b.

The input-side DC terminals DCin1b and DCin2b of the second rectifier circuit 40b are cross-connected to the output-side DC terminals DCout1a and DCout2a of the first rectifier circuit 40a. That is, the first half-wave rectification circuit 41a of the first rectification circuit 40a is connected to the second half-wave rectification circuit 42b of the second rectification circuit 40b via the DC terminal DCout1a and the DC terminal DCin2b. The second half-wave rectification circuit 42a of the first rectification circuit 40a is connected to the first half-wave rectification circuit 41b of the second rectification circuit 40b via the DC terminal DCout2a and the DC terminal DCin1b.

The third rectifier circuit 40c, which is the third stage rectifier circuit, includes a transistor MN31 that is an NMOS transistor, a transistor MP31 that is a PMOS transistor, a transistor MN32 that is an NMOS transistor, and a transistor MP32 that is a PMOS transistor.

The transistors MN31 and MP31 constitute a first half-wave rectifier circuit 41c. The transistors MN32 and MP32 constitute a second half-wave rectifier circuit 42c. The first half-wave rectification circuit 41c and the second half-wave rectification circuit 42c are connected in parallel, operate in opposite phases by differentially input AC signals, and constitute a full-wave rectification circuit as a whole.

The third rectifier circuit 40c includes input-side DC terminals DCin1c and DCin2c that are separated and an output-side DC terminal DCout. The DC terminal DCout is connected to a load RL and a capacitance CL. The DC terminal DCin1c is connected to the first half-wave rectification circuit 41c, and the DC terminal DCin2c is connected to the second half-wave rectification circuit 42c.

The input-side DC terminals DCin1c and DCin2c of the third rectifier circuit 40c are cross-connected to the output-side DC terminals DCout1b and DCout2b of the second rectifier circuit 40b. That is, the first half-wave rectification circuit 41b of the second rectifier circuit 40b is connected to the second half-wave rectifier circuit 42c of the third rectifier circuit 40c via the DC terminal DCout1b and the DC terminal DCin2c. The second half-wave rectifier circuit 42b of the second rectifier circuit 40b is connected to the first half-wave rectifier circuit 41c of the third rectifier circuit 40c via the DC terminal DCout2b and the DC terminal DCin1c.

An AC signal is directly applied from the AC signal source ACS to the AC terminals RFin_p1 and RFin_m1 of the first rectifier circuit 40a. On the other hand, the AC terminals RFin_p2 and RFin_m2 of the second rectifier circuit 40b and the AC terminals RFin_p3 and RFin_m3 of the third rectifier circuit 40c receive an AC signal via a coupling capacitance Cc.

The AC terminals RFin_p1 and RFin_m1 of the first rectifier circuit 40a, which is the first stage rectification circuit, the AC terminals RFin_p2 and RFin_m2 of the second rectification circuit 40b, which is the second stage rectification circuit, and the AC terminals RFin_p3 and RFin_m3 of the third rectifier circuit 40c, which is the third stage rectification circuit, have a DC potential difference therebetween, and cannot be directly connected with each other in parallel. For this reason, the coupling capacitance Cc is provided so as to cancel the DC potential difference and allow the AC signal through. In the first rectifier circuit 40a, the second rectifier circuit 40b, and the third rectifier circuit 40c, AC terminals are connected in parallel via a coupling capacitance and an AC terminal.

In the rectifier circuit 40 of this embodiment, AC terminals of the rectifier circuits of three stages are connected in parallel, DC terminals are cascaded with cross-over, and each rectifier performs the same rectification operation. This way, the entire circuit can output a high voltage as a whole while the DC output voltage of each rectifier is kept low.

In the rectifier circuit 40 of this embodiment, the DC terminals are cross-connected with each other as described above. Therefore, when the transistor MP11 is ON, for example, even if the transistor MN12 or the transistor MP21 is turned ON due to the imbalance of the input AC signal or the asymmetry of the circuit, electric charges flow only from the transistor MP11 to the transistor MN22.

On the other hand, if the DC terminals of the rectifier circuit of each stage are cascaded without crossover unlike the rectifier circuit 40 of this embodiment where the DC terminals are cascaded with cross-over, electric charges also flow from the transistor MP11 to the transistor MP21 due to parasitic capacitances and element mismatch, resulting in a reduction in efficiency of power conversion.

Thus, with the rectifier circuit 40 of this embodiment, it is possible to obtain a higher DC output voltage with a higher conversion efficiency as compared with a case where the DC terminals of the rectifier circuit of each stage are cascaded without crossover.

<Embodiment 5>

Figure 5:
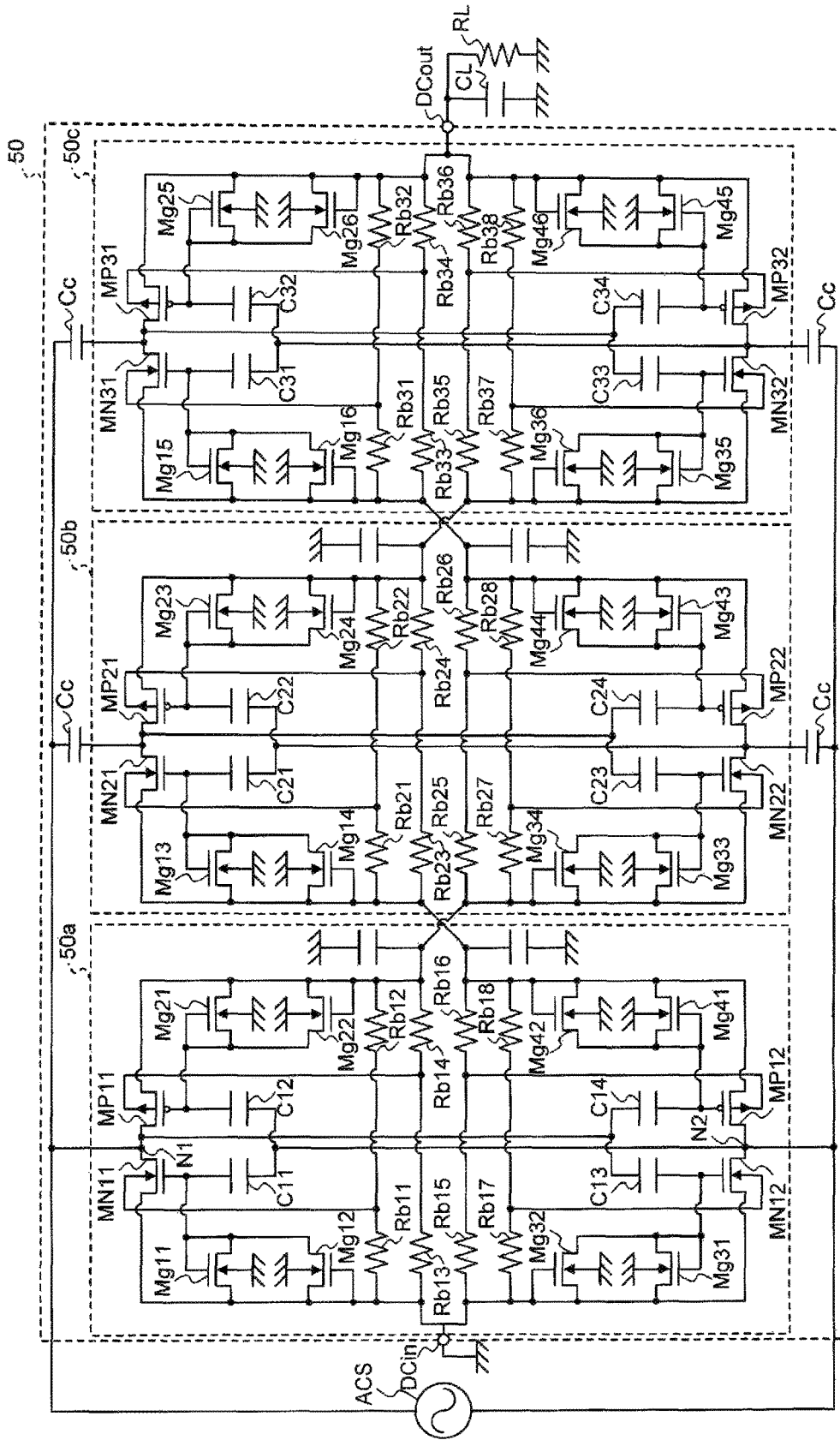
FIG. 5 is a circuit diagram showing the configuration of a rectifier circuit of Embodiment 5.

FIG. 5 is a circuit diagram showing the configuration of a rectifier circuit 50 of Embodiment 5. The rectifier circuit 50 has a configuration in which a first rectifier circuit 50a, a second rectifier circuit 50b, and a third rectifier circuit 50c are cascaded in three stages.

The first rectifier circuit 50a has a similar configuration to the rectifier circuit 30 of Embodiment 3. In other words, the first rectifier circuit 50a has a resistance Rb11 and a resistance Rb12 connected in series between the input-side DC terminal DCin and the two output-side DC terminals, and the connection point of the resistances Rb11 and Rb12 is connected to the body of the transistor MN11. The first rectifier circuit 50a also has a resistance Rb13 and a resistance Rb14 connected in series between the input-side DC terminal DCin and the two output-side DC terminals, and the connection point of the resistances Rb13 and Rb14 is connected to the body of the transistor MP11. The first rectifier circuit 50a also has a resistance Rb15 and a resistance Rb16 connected in series between the input-side DC terminal DCin and the two output-side DC terminals, and the connection point of the resistances Rb15 and Rb16 is connected to the body of the transistor MP12. The first rectifier circuit 50a also has a resistance Rb17 and a resistance Rb18 connected in series between the input-side DC terminal DCin and the two output-side DC terminals, and the connection point of the resistances Rb17 and Rb18 is connected to the body of the transistor MN12.

As a result, the potential obtained by dividing the potential between the DC terminals by the resistances Rb11 and Rb12 is applied to the body of the transistor MN11, the potential obtained by dividing the potential between the DC terminals by the resistances Rb13 and Rb14 is given to the body of the transistor MP11, the potential obtained by dividing the potential between the DC terminals by the resistances Rb15 and Rb16 is given to the body of the transistor MP12 and the potential obtained by dividing the potential between the DC terminals by the resistance Rb17 and Rb18 is applied to the body of the transistor MN12.

The gate electrode of the transistor MN11 is connected to the DC terminal DCin via the transistors Mg11 and Mg12, which are diode-connected NMOS transistors connected in parallel in an inverse manner, and the gate electrode of the transistor MN11 is connected to the AC signal node N2 of opposite phase in alternating current and is disconnected from the AC signal node N2 of opposite phase in direct current via the capacitance C11. The gate electrode of the transistor MP11 is connected to the DC terminal DCout via the transistors Mg21 and Mg22, which are diode-connected NMOS transistors connected in parallel in an inverse manner, and the gate electrode of the transistor MP11 is connected to the AC signal node N2 of opposite phase in alternating current and is disconnected from the AC signal node N2 of opposite phase in direct current via the capacitance C12.

The gate electrode of the transistor MN12 is connected to the DC terminal DCin via the transistors Mg31 and Mg32, which are diode-connected NMOS transistors connected in parallel in an inverse manner, and the gate electrode of the transistor MN12 is connected to the AC signal node N1 of opposite phase in alternating current and is disconnected from the AC signal node N1 in direct current via the capacitance C13. The gate electrode of the transistor MP12 is connected to the DC terminal DCout via the transistors Mg41 and Mg42, which are diode-connected NMOS transistors connected in parallel in an inverse manner, and the gate electrode of the transistor MP12 is connected to the AC signal node 1 of opposite phase in alternating current and is disconnected from the AC signal node N1 of opposite phase in direct current via the capacitance C14.

The second rectifier circuit 50b and the third rectifier circuit 50c also have the same configuration as the first rectifier circuit 50a. That is, the second and third rectifier circuits 50b and 50c each have a body potential setting circuit made of a pair of resistances connected in series, and a gate potential supply circuit made of a pair of diode-connected transistors connected in parallel in an inverse manner.

The input-side DC terminal DCin of the rectifier circuit 50a, which is the first stage rectifier circuit, is connected to the ground potential. The output-side DC terminal of the rectifier circuit 50a is separated, and is cross-connected to the input-side DC terminals of the rectifier circuit 50b, which is the second stage rectifier circuit. The input-side DC terminals and the output-side DC terminals of the rectifier circuit 50b are both separated. The output-side DC terminals of the rectifier circuit 50b are separated, and is cross-connected to the input-side DC terminals of the rectifier circuit 50c, which is the third stage rectifier circuit. The input-side DC terminals of the rectifier circuit 50c are separated. The output-side DC terminal DCout of the rectifier circuit 50c is connected to a load RL and a capacitance CL.

In the first rectifier circuit 50a, the second rectifier circuit 50b, and the third rectifier circuit 50c, AC terminals are connected in parallel in alternating current via a coupling capacitance and an AC terminal.

The rectifier circuit 50 of this embodiment has both of the features of the rectifier circuit 30 of Embodiment 3 and the rectifier circuit 40 of Embodiment 4. Thus, according to the rectifier circuit 50 of this embodiment, it is possible to reduce the input level of the AC signal that can start the rectification operation, and it is possible to operate the rectifier circuit with high efficiency at a desired input level. Also, it is possible to obtain a higher DC output voltage with a higher conversion efficiency.

As described above, in the rectifier circuit according to the present invention, it is possible not only to start the rectification operation with an AC signal of low power and low voltage amplitude, but also to realize a high output voltage with high power conversion efficiency. Therefore, the rectifier circuit of the present invention is particularly useful as a rectifier circuit for rectifying a very small signal such as a rectifier circuit installed in an RFID tag, for example.

The present invention is not limited to the respective embodiments above. In Embodiment 4 and Embodiment 5 above, the example of the rectifier circuits cascaded in three stages was described, but the number of connected rectifier circuit (number of stages) is not limited thereto. The rectifier circuit of Embodiment 4 and Embodiment 5 may have any number of rectifier circuits as long as the first to K-th rectifier circuits (k: integer of 3 or greater) are cascaded, and respective DC terminals of adjacent rectifier circuits are cross-connected.

In Embodiment 4 and Embodiment 5 above, the rectifier circuits of the second stage and the third stage receive an AC signal from the AC terminal via the coupling capacitance Cc, but for the rectifier circuit of the first stage, an AC signal is directly applied without going through a coupling capacitance Cc. However the rectifier circuit of the first stage may also be configured to receive an AC signal via a coupling capacitance Cc in a manner similar to the rectifier circuits of the second stage and the third stage.

What is claimed is:

1. A rectifier circuit configured to receive first and second alternate current (AC) signals that have opposite phases, comprising:
    a first half-wave rectifier circuit that includes a first metal-oxide-semiconductor (MOS) transistor and a second MOS transistor connected in series, and performs half-wave rectification on the first AC signal to generate a first direct current (DC) signal;
    a second half-wave rectifier circuit that includes a third MOS transistor and a fourth MOS transistor connected in series, and performs the half-wave rectification on the second AC signal to generate a second DC signal, the first DC signal and the second DC signal being outputted by the rectifier circuit to a load; and
    a body potential setting circuit configured to set a body potential of each of the first MOS transistor, the second MOS transistor, the third MOS transistor, and the fourth MOS transistor.

2. The rectifier circuit according to claim 1, further comprising a first AC terminal and a second AC terminal, and an input DC terminal and an output DC terminal, wherein
    the first and second DC signals are outputted through the output DC terminal,
    the first MOS transistor is a first channel type, and has a source, a drain, a gate and a body, one of the source and the drain being connected to the first AC terminal, another of the source and the drain being connected to the input DC terminal, the gate being connected to the second AC terminal,
    the second MOS transistor is a second channel type that has a different polarity from the first channel type, and has a source, a drain, a gate and a body, one of the source and the drain being connected to the first AC terminal, another of the source and the drain being connected to the output DC terminal, the gate being connected to the second AC terminal,
    the third MOS transistor is the first channel type, and has a source, a drain, a gate and a body, one of the source and the drain being connected to the second AC terminal, another of the source and the drain being connected to the input DC terminal, the gate being connected to the first AC terminal, the body being connected to the body of the first MOS transistor,
    the fourth MOS transistor is the second channel type, and has a source, a drain, a gate and a body, one of the source and the drain being connected to the second AC terminal, another of the source and the drain being connected to the output DC terminal, the gate being connected to the first AC terminal, the body being connected to the body of the second MOS transistor, and
    the body potential setting circuit includes:
        a first resistance and a second resistance that are connected in series between the input DC terminal and the output DC terminal, a first connection point between the first resistance and the second resistance being connected to the bodies of the first MOS transistor and the third MOS transistor; and
        a third resistance and a fourth resistance that are connected in series between the input DC terminal and the output DC terminal, a second connection point between the third resistance and the fourth resistance being connected to the bodies of the second MOS transistor and the fourth MOS transistor.

3. The rectifier circuit according to claim 1, further comprising a gate potential supply circuit that supplies a DC bias potential to a gate of each of the first MOS transistor, the second MOS transistor, the third MOS transistor, and the fourth MOS transistor.

4. The rectifier circuit according to claim 3, further comprising an input DC terminal and an output DC terminal, wherein
    the first and second DC signals are outputted through the output DC terminal, and
    the gate potential supply circuit includes:
        a first transistor pair of diode-connected MOS transistors that are connected in parallel, the first transistor pair being connected to the gate of the first MOS transistor;
        a second transistor pair of diode-connected MOS transistors that are connected in parallel, the second transistor pair being connected to the gate of the second MOS transistor;
        a third transistor pair of diode-connected MOS transistors that are connected in parallel, the third transistor pair being connected to the gate of the third MOS transistor; and
        a fourth transistor pair of diode-connected MOS transistors that are connected in parallel, the fourth transistor pair being connected to the gate of the fourth MOS transistor, and
    the diode-connected MOS transistors in each of the first to fourth transistor pairs are forward biased in two directions opposite to each other.

5. The rectifier circuit according to claim 4, wherein ones of ends of the first to fourth transistor pairs are connected to the gates of the first to fourth MOS transistors, respectively, and others of ends of the first to fourth transistor pairs are respectively connected between the input DC terminal and the output DC terminal.

6. A rectifier circuit configured to receive first and second alternate current (AC) signals that have opposite phases, comprising:
    a first half-wave rectifier circuit that includes a first metal-oxide-semiconductor (MOS) transistor and a second MOS transistor that are connected in series, and performs half-wave rectification on the first AC signal to generate a first direct current (DC) signal;
    a second half-wave rectifier circuit that includes a third MOS transistor and a fourth MOS transistor that are connected in series, and performs the half-wave rectification on the second AC signal to generate a second DC signal, the first DC signal and the second DC signal being outputted by the rectifier circuit to a load; and a gate potential supply circuit that supplies a DC bias potential to a gate of each of the first MOS transistor, the second MOS transistor, the third MOS transistor, and the fourth MOS transistor.

7. The rectifier circuit according to claim 6, further comprising a first AC terminal and a second AC terminal, and an input DC terminal and an output DC terminal, wherein
the first and second DC signals are outputted through the output DC terminal,
the first MOS transistor is a first channel type, and has a source, a drain, a gate and a body, one of the source and the drain being connected to the first AC terminal, another of the source and the drain being connected to the input DC terminal, the gate being connected to the second AC terminal,
the second MOS transistor is a second channel type that has a different polarity from the first channel type, and has a source, a drain, a gate and a body, one of the source and the drain being connected to the first AC terminal, another of the source and the drain being connected to the output DC terminal, the gate being connected to the second AC terminal,
the third MOS transistor is the first channel type, and has a source, a drain, a gate and a body, one of the source and the drain being connected to the second AC terminal, another of the source and the drain being connected to the input DC terminal, the gate being connected to the first AC terminal, the body being connected to the body of the first MOS transistor,
the fourth MOS transistor is the second channel type, and has a source, a drain, a gate and a body, one of the source and the drain being connected to the second AC terminal, another of the source and the drain being connected to the output DC terminal, the gate being connected to the first AC terminal, the body being connected to the body of the second MOS transistor, and
the gate potential supply circuit includes:
a first transistor pair of diode-connected MOS transistors that are connected in parallel, the first transistor pair being connected to the gate of the first MOS transistor;
a second transistor pair of diode-connected MOS transistors that are connected in parallel, the second transistor pair being connected to the gate of the second MOS transistor;
a third transistor pair of diode-connected MOS transistors that are connected in parallel, the third transistor pair being connected to the gate of the third MOS transistor; and
a fourth transistor pair of diode-connected MOS transistors that are connected in parallel, the fourth transistor pair being connected to the gate of the fourth MOS transistor, and
the diode-connected MOS transistors in each of the first to fourth transistor pairs are forward biased in two directions opposite to each other.

8. The rectifier circuit according to claim 7, wherein one ends of the first to fourth transistor pairs are connected to the gate of the first to fourth MOS transistors, respectively, and the other ends of the first to fourth transistor pairs are respectively connected between the input DC terminal and the output DC terminal.

9. A rectifier circuit, comprising:
first to k-th rectifier circuits connected in cascade and being configured to convert an applied alternate current (AC) signal to a direct current (DC) signal, k being an integer greater than 2, each of the first to k-th rectifier circuits including:
a first half-wave rectifier circuit that performs half-wave rectification on a first AC signal to generate a first DC signal; and
a second half-wave rectifier circuit that performs the half-wave rectification on a second AC signal to generate a second DC signal, wherein
all of the rectifier circuits, except for the k-th rectifier circuit, have separate first and second output DC terminals, and
all of the rectifier circuits, except for the first rectifier circuit, have separate first and second input DC terminals, the first and second output DC terminals of each rectifier circuit being cross-connected to the second and first input DC terminals of a subsequent rectifier circuit.

10. The rectifier circuit according to claim 9, wherein
the first half-wave rectifier circuit and the second half-wave rectifier circuit of each rectifier circuit except the k-th rectifier circuit are respectively connected to the first and second output DC terminals, and
the first half-wave rectifier circuit and the second half-wave rectifier circuit of each rectifier circuit except the first rectifier circuit are respectively connected to the first and second input DC terminals, of said each rectifier circuit.

11. The rectifier circuit according to claim 10, further comprising a plurality of coupling capacitances, wherein
each of the second to k-th rectifier circuits is connected to an AC signal source via a corresponding one of the coupling capacitances, and
the first to k-th rectifier circuits are respectively connected in parallel via the corresponding one of the coupling capacitances.

12. The rectifier circuit according to claims 9, wherein
the first half-wave rectifier circuit includes a first metal-oxide-semiconductor (MOS) transistor and a second MOS transistor that are connected in series,
the second half-wave rectifier circuit includes a third MOS transistor and a fourth MOS transistor that are connected in series, and
each of the first to k-th rectifier circuits further includes a body potential setting circuit that sets a body potential of each of the first MOS transistor, the second MOS transistor, the third MOS transistor, and the fourth MOS transistor.

13. The rectifier circuit according to claim 12, wherein
the first to k-th rectifier circuits respectively include first and second AC terminals, and
in each of the first to k-th rectifier circuits,
the first MOS transistor is a first channel type, and has a source, a drain, a gate and a body, one of the source and the drain being connected to the first AC terminal, another of the source and the drain being connected to the first input DC terminal, the gate being connected to the second AC terminal,
the second MOS transistor is a second channel type that has a different polarity from the first channel type, and having a source, a drain, a gate and a body, one of the source and the drain being connected to the first AC terminal, another of the source and the drain being connected to the first output DC terminal, the gate being connected to the second AC terminal,
the third MOS transistor is the first channel type, and has a source, a drain, a gate and a body, one of the source and the drain being connected to the second AC terminal, another of the source and the drain being connected to the second input DC terminal, the gate being connected to the first AC terminal, the body being connected to the body of the first MOS transistor, the fourth MOS transistor is the second channel type, and has a source, a drain, a gate and a body, one of the source and the drain being connected to the second AC terminal, another of the source and the drain being connected to the second output DC terminal, the gate being connected to the first AC terminal, the body being connected to the body of the second MOS transistor, and the body potential setting circuit includes:
- a first resistance and a second resistance that are connected in series between the first input DC terminal and the first output DC terminal, a first connection point between the first resistance and the second resistance being connected to the bodies of the first MOS transistor and the third MOS transistor; and
- a third resistance and a fourth resistance that are connected in series between the second input DC terminal and the second output DC terminal, a second connection point between the third resistance and the fourth resistance being connected to the bodies of the second MOS transistor and the fourth MOS transistor.

14. The rectifier circuit according to claim 9, wherein in each of the first to k-th rectifier circuits,
the first half-wave rectifier circuit includes a first metal-oxide-semiconductor (MOS) transistor and a second MOS transistor connected in series,
the second half-wave rectifier circuit includes a third MOS transistor and a fourth MOS transistor connected in series, and
each of the first to k-th rectifier circuits further includes a gate potential supply circuit that supplies a DC bias potential to a gate of each of the first MOS transistor, the second MOS transistor, the third MOS transistor, and the fourth MOS transistor.

15. The rectifier circuit according to claim 14, wherein the first to k-th rectifier circuits respectively includes first and second AC terminals, and in each of the first to k-th rectifier circuits,
the first MOS transistor is a first channel type, and has a source, a drain, a gate and a body, one of the source and the drain being connected to the first AC terminal, another of the source and the drain being connected to the first input DC terminal, the gate being connected to the second AC terminal,
the second MOS transistor is a second channel type that has a different polarity from the first channel type, and has a source, a drain, a gate and a body, one of the source and the drain being connected to the first AC terminal, another of the source and the drain being connected to the first output DC terminal, the gate being connected to the second AC terminal,
the third MOS transistor is the first channel type, and has a source, a drain, a gate and a body, one of the source and the drain being connected to the second AC terminal, another of the source and the drain being connected to the second input DC terminal, the gate being connected to the first AC terminal, the body being connected to the body of the first MOS transistor,
the fourth MOS transistor is the second channel type, and has a source, a drain, a gate and a body, one of the source and the drain being connected to the second AC terminal, another of the source and the drain being connected to the second output DC terminal, the gate being connected to the first AC terminal, the body being connected to the body of the second MOS transistor, and the gate potential supply circuit includes:
- a first transistor pair of diode-connected MOS transistors that are connected in parallel, the first transistor pair being connected to the gate of the first MOS transistor;
- a second transistor pair of diode-connected MOS transistors that are connected in parallel, the second transistor pair being connected to the gate of the second MOS transistor;
- a third transistor pair of diode-connected MOS transistors that are connected in parallel, the third transistor pair being connected to; and
- a fourth transistor pair of diode-connected MOS transistors that are connected in parallel, the fourth transistor pair being connected to the gate of the fourth MOS transistor, and
the diode-connected MOS transistors in each of the first to fourth transistor pairs are forward biased in two directions opposite to each other.

16. The rectifier circuit according to claim 15, wherein ones of ends of the first to fourth transistor pairs are connected to the gates of the first to fourth MOS transistors, respectively,
others of ends of the first and second transistor pairs are respectively connected between the first input DC terminal and the first output DC terminal, and
others of ends of the third and fourth transistor pairs are respectively connected between the second input DC terminal and the second output DC terminal.

* * * * *